US010491095B2

(12) United States Patent
Chen et al.

(10) Patent No.: US 10,491,095 B2
(45) Date of Patent: Nov. 26, 2019

(54) DYNAMIC IGBT GATE DRIVE FOR VEHICLE TRACTION INVERTERS

(71) Applicant: Ford Global Technologies, LLC, Dearborn, MI (US)

(72) Inventors: Lihua Chen, Northville, MI (US); Dong Cao, Canton, MI (US); Shailesh Shrikant Kozarekar, Novi, MI (US); Shahram Zarei, Farmington Hills, MI (US); Hongjie Wu, Canton, MI (US); Yuqing Tang, Northville, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 531 days.

(21) Appl. No.: 14/506,746

(22) Filed: Oct. 6, 2014

(65) Prior Publication Data

US 2016/0099665 A1 Apr. 7, 2016

(51) Int. Cl.
*H01L 27/06* (2006.01)
*H01L 23/02* (2006.01)
(Continued)

(52) U.S. Cl.
CPC ............... *H02M 1/08* (2013.01); *B60L 1/003* (2013.01); *B60L 1/02* (2013.01); *B60L 15/007* (2013.01); *B60L 50/16* (2019.02); *B60L 50/61* (2019.02); *B60L 50/66* (2019.02); *B60L 53/14* (2019.02); *B60L 58/20* (2019.02); *H02M 7/53871* (2013.01); *H02P 29/68* (2016.02); *H03K 17/14* (2013.01); *B60L 2210/10* (2013.01); *B60L 2210/30* (2013.01); *B60L 2210/40* (2013.01); *B60L 2240/12* (2013.01); *B60L 2240/34* (2013.01); *B60L 2240/36* (2013.01); *B60L 2240/421* (2013.01); *B60L 2240/423* (2013.01); *B60L 2240/425* (2013.01); *B60L 2240/441* (2013.01); *B60L 2240/443* (2013.01);
(Continued)

(58) Field of Classification Search
CPC .............................. H01L 23/08; H01L 29/739
See application file for complete search history.

(56) References Cited

U.S. PATENT DOCUMENTS

| 5,808,504 A | 9/1998 | Chikai et al. |
| 6,285,235 B1 | 9/2001 | Ichikawa et al. |

(Continued)

FOREIGN PATENT DOCUMENTS

CN 102088280 A 6/2011

*Primary Examiner* — Bickey Dhakal
*Assistant Examiner* — Charles S Laughlin
(74) *Attorney, Agent, or Firm* — David B. Kelley; Brooks Kushman P.C.

(57) ABSTRACT

A hybrid electric vehicle includes a traction battery, traction motor and power inverter therebetween. The power inverter converts the DC power of the traction battery to AC power to drive each phase of the traction motor. The power inverter includes Insulated Gate Bipolar junction Transistors (IGBTs) to modulate the power to the traction motor. The speed at which the IGBTs are modulated impacts the system performance including power loss, voltage overshoot and current overshoot. Using a dual emitter IGBT to provide a current mirror of the drive current, circuitry may be used with the gate drive circuitry such that the gate drive speed may be dynamically adjusted based on characteristics including temperature and traction motor rotational speed.

17 Claims, 4 Drawing Sheets

(51) Int. Cl.

| | | |
|---|---|---|
| *H02M 1/08* | (2006.01) | |
| *H02M 7/5387* | (2007.01) | |
| *B60L 1/00* | (2006.01) | |
| *B60L 1/02* | (2006.01) | |
| *B60L 15/00* | (2006.01) | |
| *H03K 17/14* | (2006.01) | |
| *H02P 29/68* | (2016.01) | |
| *B60L 53/14* | (2019.01) | |
| *B60L 50/61* | (2019.01) | |
| *B60L 50/16* | (2019.01) | |
| *B60L 58/20* | (2019.01) | |
| *B60L 50/60* | (2019.01) | |
| *H02M 1/00* | (2006.01) | |
| *H02M 1/32* | (2007.01) | |

(52) U.S. Cl.
CPC ... *B60L 2240/547* (2013.01); *B60L 2240/549* (2013.01); *H02M 2001/0009* (2013.01); *H02M 2001/327* (2013.01); *Y02T 10/6217* (2013.01); *Y02T 10/645* (2013.01); *Y02T 10/7005* (2013.01); *Y02T 10/7066* (2013.01); *Y02T 10/7072* (2013.01); *Y02T 10/7077* (2013.01); *Y02T 10/7216* (2013.01); *Y02T 10/7241* (2013.01); *Y02T 90/127* (2013.01); *Y02T 90/14* (2013.01)

(56) References Cited

U.S. PATENT DOCUMENTS

| | | | |
|---|---|---|---|
| 6,304,472 B1 * | 10/2001 | Nagasu | H02M 7/003 |
| | | | 323/282 |
| 6,384,552 B2 | 5/2002 | Shimane et al. | |
| 6,717,785 B2 * | 4/2004 | Fukuda | H03K 17/0828 |
| | | | 361/86 |
| 7,084,590 B2 | 8/2006 | Miyamoto et al. | |
| 8,362,812 B2 | 1/2013 | Lee | |
| 8,610,485 B2 | 12/2013 | Hiyama | |
| 9,780,660 B2 * | 10/2017 | Hashimoto | H02M 1/32 |
| 2002/0070772 A1 | 6/2002 | Neacsu et al. | |
| 2009/0057832 A1 * | 3/2009 | Kouno | H01L 29/7397 |
| | | | 257/577 |
| 2011/0133790 A1 | 6/2011 | Nagata et al. | |
| 2011/0273206 A1 * | 11/2011 | Lee | H02M 1/08 |
| | | | 327/109 |
| 2012/0229942 A1 * | 9/2012 | Hussein | H03K 17/0828 |
| | | | 361/57 |
| 2013/0066510 A1 * | 3/2013 | Lasson | B60L 3/0084 |
| | | | 701/22 |
| 2013/0234778 A1 | 9/2013 | Kuwabara et al. | |
| 2014/0049867 A1 * | 2/2014 | Kikuchi | H03K 17/0828 |
| | | | 361/87 |
| 2014/0375333 A1 * | 12/2014 | Minagawa | H02M 1/08 |
| | | | 324/537 |
| 2015/0180453 A1 * | 6/2015 | Mori | H02M 1/088 |
| | | | 327/109 |

* cited by examiner

DYNAMIC IGBT GATE DRIVE FOR VEHICLE TRACTION INVERTERS

TECHNICAL FIELD

This application is generally related to control of an IGBT in a traction inverter based on characteristics including a minor current, an IGBT temperature and traction motor rotational speed.

BACKGROUND

Hybrid-electric and pure electric vehicles rely on a traction battery to provide power to a traction motor for propulsion and a power inverter therebetween to convert battery DC power to AC power used by the traction motor. The typical AC traction motor is a 3-phase motor which may be powered by 3 sinusoidal signals each driven with 120 degrees phase separation. The traction motors may require high voltages and high currents. Due to the voltage, current and switching requirements, an Insulated Gate Bipolar junction Transistor (IGBT) is typically used to generate the signals in the power inverter.

SUMMARY

An inverter controller includes a dual emitter IGBT having a gate, a first emitter and second emitter. The first emitter may be configured to flow a load current and a second emitter may be configured to flow a minor current proportional to the load current. The inverter controller further includes a gate driver coupled to the gate and configured to flow a plurality of currents, a buffer circuit to output a buffered signal based on the mirror current, and a latch circuit to output a signal to configure the gate driver to flow a selected current from the plurality of currents in response to the buffered signal and a gate voltage greater than a threshold.

An inverter controller includes an IGBT having a gate, a first emitter and second emitter, and is configured such that a minor current flowing from the first emitter is proportional to a load current flowing from the second emitter. The inverter controller further includes a variable current voltage control device coupled to the gate, and at least one controller programmed to change a current flow from the variable current voltage control device based on the mirror current.

A method for controlling a vehicle inverter includes applying a gate voltage to an IGBT, including a first and second emitter, to cause a current flow, sampling a mirror current output from the second IGBT emitter that is proportional to a drive current output from the first IGBT emitter in response to the gate voltage, and changing the current flow to the gate in response to the mirror current and the gate voltage.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
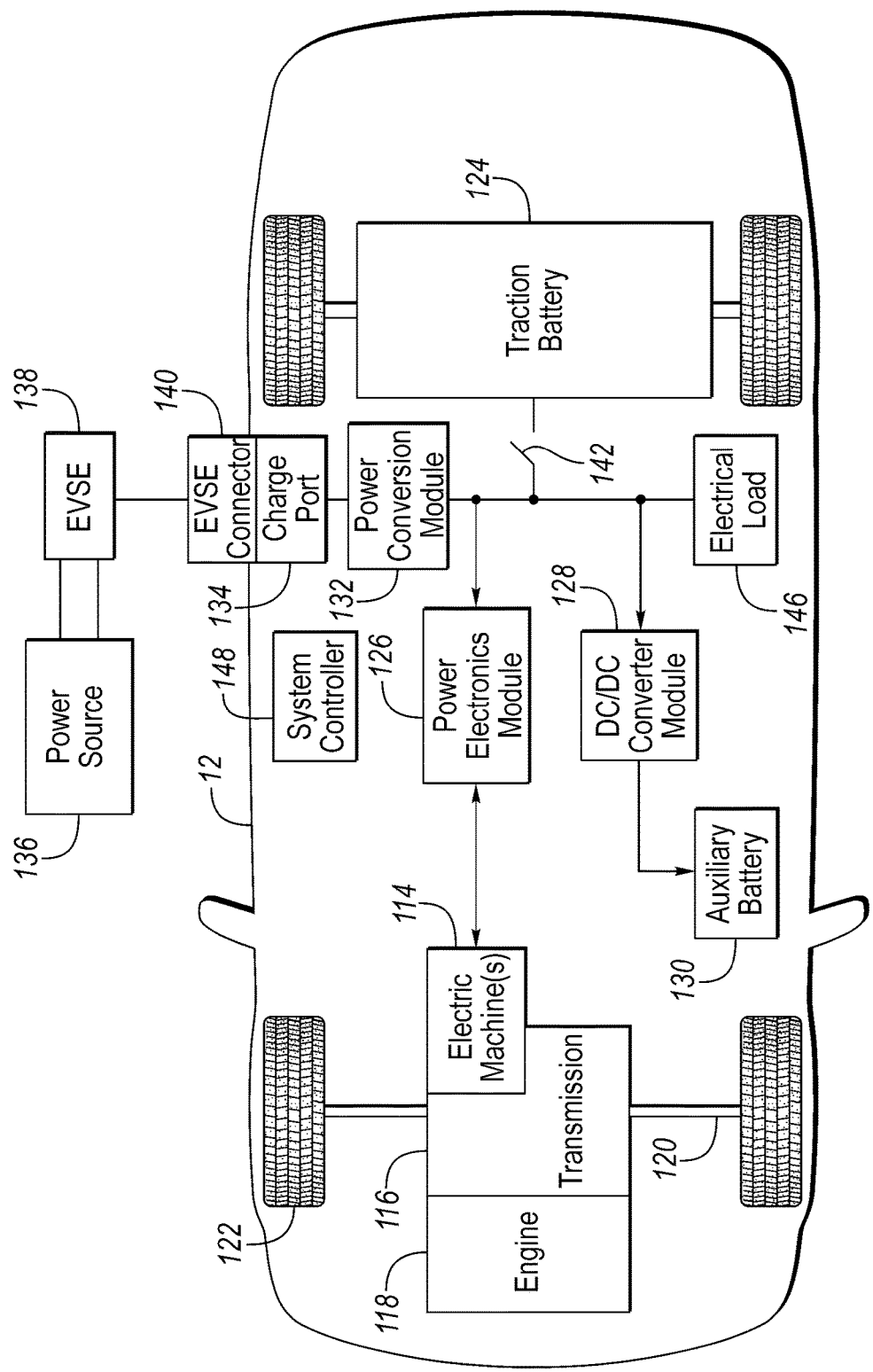
FIG. 1 is a diagram of an exemplary hybrid vehicle illustrating typical drivetrain and energy storage components with a power inverter therebetween.

FIG. 1 depicts a hybrid-electric vehicle (HEV) 112. The hybrid-electric vehicle 112 may comprise one or more electric machines 114 coupled to a hybrid transmission 116. The electric machines 114 may be capable of operating as a motor or a generator. In addition, the hybrid transmission 116 is coupled to an internal combustion engine (ICE) 118. The hybrid transmission 116 is also coupled to a drive shaft 120 that is coupled to the wheels 122. The electric machines 114 can provide propulsion and deceleration capability when the engine 118 is turned on or off. The electric machines 114 also act as generators and can provide fuel economy benefits by recovering energy that would normally be lost as heat in the friction braking system. The electric machines 114 may also reduce vehicle emissions by allowing the engine 118 to operate at more efficient conditions (engine speeds and loads) and allowing the hybrid-electric vehicle 112 to be operated in electric mode with the engine 118 off under certain conditions.

A traction battery or battery pack 124 stores energy that can be used by the electric machines 114. A vehicle battery pack 124 typically provides a high voltage DC output. The traction battery 124 is electrically connected to one or more power electronics modules. One or more contactors 142 may isolate the traction battery 124 from other components when opened and connect the traction battery 124 to other components when closed. The power electronics module 126 is also electrically connected to the electric machines 114 and provides the ability to bi-directionally transfer energy between the traction battery 124 and the electric machines 114. For example, a typical traction battery 124 may provide a DC voltage while the electric machines 114 may use a three-phase AC current to function. The power electronics module 126 may convert the DC voltage to produce a three-phase AC current used by the electric machines 114. In a regenerative mode, the power electronics module 126 may convert the three-phase AC current, from the electric machines 114 acting as generators, to a DC voltage to charge the traction battery 124. The description herein is equally applicable to a pure electric vehicle. For a pure electric vehicle, the hybrid transmission 116 may be a gear box connected to an electric machine 114 and the engine 118 may not be present. The power electronics module 126 may further include a DC to DC converter having high power switches (e.g., IGBTs) to convert a power electronics module input voltage to a power electronics module output voltage via boost, buck or a combination thereof.

In addition to providing energy for propulsion, the traction battery 124 may provide energy for other vehicle electrical systems. A vehicle may include a DC/DC converter module 128 that converts the high voltage DC output of the traction battery 124 to a low voltage DC supply that is compatible with other vehicle loads. Other high-voltage electrical loads 146, such as compressors and electric heaters, may be connected directly to the high-voltage without the use of a DC/DC converter module 128. The electrical loads 146 may have an associated controller that operates the electrical load 146 when appropriate. The low-voltage systems may be electrically connected to an auxiliary battery 130 (e.g., 12V battery). The DC/DC converter module 128 may include high power switches (e.g., IGBTs) to convert a DC/DC converter module input voltage to a DC/DC converter module output voltage via boost, buck or a combination thereof. The DC/DC converter module 128 may also operate bi-directionally.

The vehicle 112 may be an electric vehicle or a hybrid vehicle in which the traction battery 124 may be recharged by an external power source 136. The external power source 136 may be a connection to an electrical outlet. The external power source 136 may be electrically connected to electric vehicle supply equipment (EVSE) 138. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 12. The charge port 134 may be any type of port configured to transfer power from the EVSE 138 to the vehicle 112. The charge port 134 may be electrically connected to a charger or on-board power conversion module 132. The power conversion module 132 may condition the power supplied from the EVSE 138 to provide the proper voltage and current levels to the traction battery 124. The power conversion module 132 may include high power switches (e.g., IGBTs) to convert a conversion module input voltage to a conversion module output voltage via boost, buck or a combination thereof. The EVSE connector 140 may have pins that mate with corresponding recesses of the charge port 134. Alternatively, various components described as being electrically connected may transfer power using a wireless inductive coupling.

The various components discussed may have one or more associated controllers to control and monitor the operation of the components. The controllers may communicate via a serial bus (e.g., Controller Area Network (CAN)) or via discrete conductors. In addition, a system controller 148 may be present to coordinate the operation of the various components. A traction battery 124 may be constructed from a variety of chemical formulations. Typical battery pack chemistries may be lead acid, nickel-metal hydride (NIMH) or Lithium-Ion.

Figure 2:
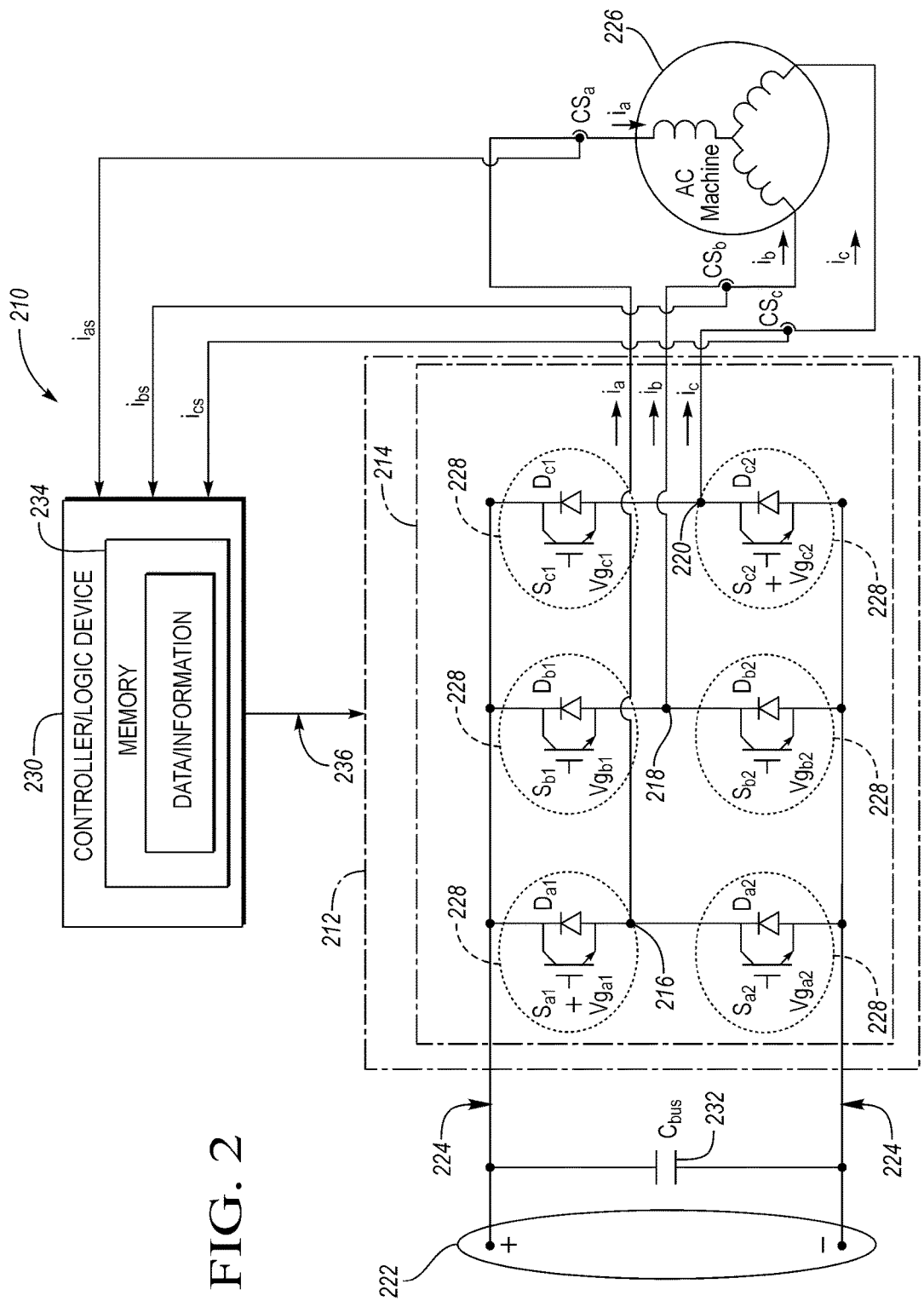
FIG. 2 is a schematic of an exemplary vehicular electric motor inverter.

With reference to FIG. 2, a system 210 is provided for controlling a power converter system 212. The power converter system 212 of FIG. 2 is shown to include an inverter 214 with first, second, and third phase legs 216, 218, 220. While the inverter 214 is shown as a three-phase converter, the inverter 214 may include additional phase legs. For example, the inverter 214 may be a four-phase converter, a five-phase converter, a six-phase converter, etc. In addition, the power converter system 212 may include multiple converters with each inverter 214 in the converter system 212 including three or more phase legs. For example, the system 210 may control two or more inverters 214 in the power converter system 212. The converter system 212 may further include a DC to DC converter having high power switches (e.g., IGBTs) to convert a power electronics module input voltage to a power electronics module output voltage via boost, buck or a combination thereof.

As shown in FIG. 2, the inverter 214 may be a DC-to-AC converter. In operation, the DC-to-AC converter receives DC power from a DC power link 222 through a DC bus 224 and converts the DC power to AC power. The AC power is transmitted via the phase currents ia, ib, and is to drive an AC machine 226, such as a three-phase permanent-magnet synchronous motor (PMSM) as depicted in FIG. 2. In such an example, the DC power link 222 may include a DC storage battery to provide DC power to the DC bus 224. In another example, the inverter 214 may operate as an AC-to-DC converter that converts AC power from the AC machine 226 (e.g., generator) to DC power, which the DC bus 224 can provide to the DC power link 222. Furthermore, the system 210 may control the power converter system 212 in other power electronic topologies.

With continuing reference to FIG. 2, each of the phase legs 216, 218, 220 in the inverter 214 includes power switches 228, which may be implemented by various types of controllable switches. In one embodiment, each power switch 228 may include a diode and a transistor, (e.g., an IGBT). The diodes of FIG. 2 are labeled $D_{a1}$, $D_{a2}$, $D_{b1}$, $D_{b2}$, $D_{c1}$, and $D_{c2}$ while the IGBTs of FIG. 2 are respectively labeled $S_{a1}$, $S_{a2}$, $S_{b1}$, $S_{b2}$, $S_{c1}$, and $S_{c2}$. The power switches with $S_{a1}$, $S_{a2}$, $D_{a1}$, and $D_{a2}$ are part of phase leg A of the three-phase converter, which is labeled as the first phase leg 216 in FIG. 2. Similarly, the power switches with $S_{b1}$, $S_{b2}$, $D_{b1}$, and $D_{b2}$ are part of phase leg B and the power switches with $S_{c1}$, $S_{c2}$, $D_{c1}$, and $D_{c2}$ are part of phase leg C of the three-phase converter. The inverter 214 may include any number of the power switches 228 or circuit elements depending on the particular configuration of the inverter 214.

As illustrated in FIG. 2, current sensors $CS_a$, $CS_b$, and $CS_c$ are provided to sense current flow in the respective phase legs 216, 218, 220. FIG. 2 shows the current sensors $CS_a$, $CS_b$, and $CS_c$ separate from the power converter system 212. However, current sensors $CS_a$, $CS_b$, and $CS_c$ may be integrated as part of the power converter system 212 depending on its configuration. Current sensors $CS_a$, $CS_b$, and $CS_c$ of FIG. 2 are installed in series with each of phase legs A, B and C (i.e., phase legs 216, 218, 220 in FIG. 2) and provide the respective feedback signals $i_{as}$, $i_{bs}$, and $i_{cs}$ (also illustrated in FIG. 2) for the system 210. The feedback signals $i_{as}$, $i_{bs}$, and $i_{cs}$ may be raw current signals processed by logic device (LD) 230 or may be embedded or encoded with data or information about the current flow through the respective phase legs 216, 218, 220. Also, the power switches 228 (e.g., IGBTs) may include current sensing capability. The current sensing capability may include being configured with a current minor output, which may provide data/signals representative of $i_{as}$, $i_{bs}$, and $i_{cs}$. The data/signals may indicate a direction of current flow, a magnitude of current flow, or both the direction and magnitude of current flow through the respective phase legs A, B, and C.

Referring again to FIG. 2, the system 210 includes a logic device (LD) or controller 230. The controller or LD 230 can be implemented by various types or combinations of electronic devices and/or microprocessor-based computers or controllers. To implement a method of controlling the power converter system 212, the controller 230 may execute a computer program or algorithm embedded or encoded with the method and stored in volatile and/or persistent memory 234. Alternatively, logic may be encoded in discrete logic, a microprocessor, a microcontroller, or a logic or gate array stored on one or more integrated circuit chips. As shown in the embodiment of FIG. 2, the controller 230 receives and processes the feedback signals $i_{as}$, $i_{bs}$, and $i_{cs}$ to control the phase currents $i_a$, $i_b$, and $i_c$ such that the phase currents $i_a$, $i_b$, and $i_c$ flow through the phase legs 216, 218, 220 and into the respective windings of the AC machine 226 according to various current or voltage patterns. For example, current patterns can include patterns of phase currents $i_a$, $i_b$, and $i_c$ flowing into and away from the DC-bus 224 or a DC-bus capacitor 232. The DC-bus capacitor 232 of FIG. 2 is shown separate from the power converter system 212. However, the DC-bus capacitor 232 may be integrated as part of the power converter system 212.

As shown in FIG. 2, a storage medium 234 (hereinafter "memory"), such as computer-readable memory may store the computer program or algorithm embedded or encoded with the method. In addition, the memory 234 may store data or information about the various operating conditions or components in the power converter system 212. For example, the memory 234 may store data or information about current flow through the respective phase legs 216, 218, 220. The memory 234 can be part of the controller 230 as shown in FIG. 2. However, the memory 234 may be positioned in any suitable location accessible by the controller 230.

As illustrated in FIG. 2, the controller 230 transmits at least one control signal 236 to the power converter system 212. The power converter system 212 receives the control signal 236 to control the switching configuration of the inverter 214 and therefore the current flow through the respective phase legs 216, 218, and 220. The switching configuration is a set of switching states of the power switches 228 in the inverter 214. In general, the switching configuration of the inverter 214 determines how the inverter 214 converts power between the DC power link 222 and the AC machine 226.

To control the switching configuration of the inverter 214, the inverter 214 changes the switching state of each power switch 228 in the inverter 214 to either an ON state or an OFF state based on the control signal 236. In the illustrated embodiment, to switch the power switch 228 to either ON or OFF states, the inverter 214 controls the gate voltage (Vg) applied to each power switch 228 and therefore the switching state of each power switch 228. Gate voltages $Vg_{a1}$, $Vg_{a2}$, $Vg_{b1}$, $Vg_{b2}$, $Vg_{c1}$, and $Vg_{c2}$ (shown in FIG. 2) control the switching state and characteristics of the respective power switches 228. While the inverter 214 is shown as a voltage-driven device in FIG. 2, the inverter 214 may be a current-driven device or controlled by other strategies that switch the power switch 228 between ON and OFF states. The controller 230 may change the gate drive for each IGBT based on the rotational speed of the AC machine 226, the minor current, or a temperature of the IGBT switch. The change in gate drive may be selected from a plurality of gate drive currents in which the change gate drive current is proportional to a change in IGBT switching speed.

As also shown in FIG. 2, each phase leg 216, 218, and 220 includes two switches 228. However, only one switch in each of the legs 216, 218, 220 can be in the ON state without shorting the DC power link 222. Thus, in each phase leg, the switching state of the lower switch is typically opposite to the switching state of the corresponding upper switch. Consequently, a HIGH state of a phase leg refers to the upper switch in the leg in the ON state with the lower switch in the OFF state. Likewise, a LOW state of the phase leg refers to the upper switch in the leg in the OFF state with the lower switch in the ON state. As a result, IGBTs with current minor capability may be on all IGBTs, a subset of IGBTs (e.g., $S_{a1}$, $S_{b1}$, $S_{c1}$) or a single IGBT.

Two situations can occur during an active state of the three-phase converter example illustrated in FIG. 2: (1) two phase legs are in the HIGH state while the third phase leg is in the LOW state, or (2) one phase leg is in the HIGH state while the other two phase legs are in the LOW state. Thus, one phase leg in the three-phase converter, which may be defined as the "reference" phase for a specific active state of the inverter 214, is in a state opposite to the other two phase legs, or "non-reference" phases, that have the same state. Consequently, the non-reference phases are either both in the HIGH state or both in the LOW state during an active state of the inverter 214.

Figure 3:
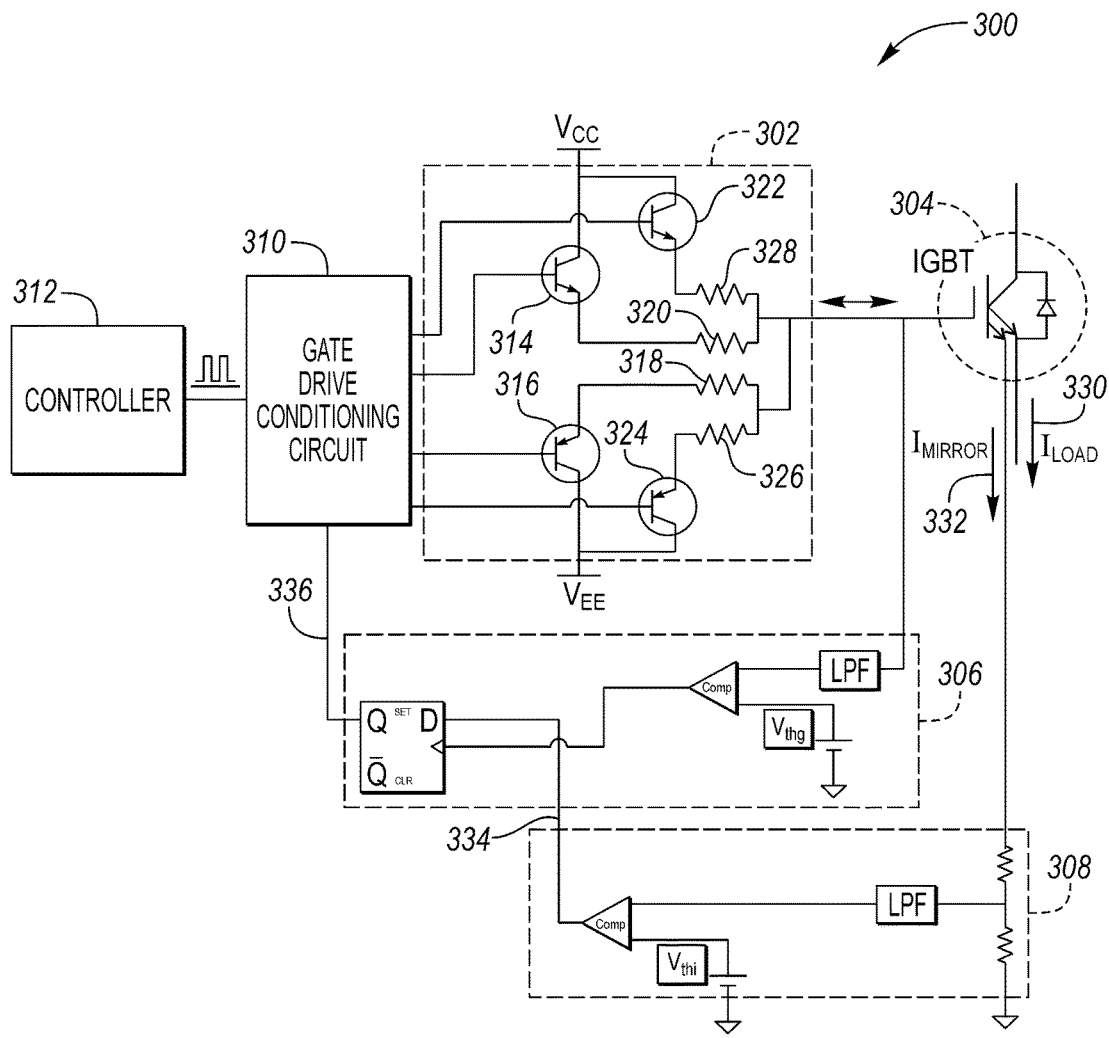
FIG. 3 is a schematic of an exemplary configuration of an IGBT driver with mirror current feedback.

FIG. 3 is a schematic of an example configuration of a switch driver with a mirror current feedback 300. The switch 304 may include a MOSFET, an IGBT or similar solid state switch. The switch may be monolithic or may be structured as a multi-chip module. The switch is configured to drive a load current ($I_{Load}$) 320 and to drive a minor current ($I_{mirror}$) 332. The load current may be used to drive a traction motor as part of an inverter or may be used to switch the load current into an inductor as part of a DC-DC power converter. The operation of the switch 304 is controlled by a controller 312. The controller may be a microprocessor, microcontroller, Application Specific Integrated Circuit (ASIC), Programmable Logic Device (PLD) or may be discrete analog or digital circuitry. The controller may produce a modulation signal, of a form such as a pulse train, pulse width modulated (PWM) or similar, to control the gate modulation.

The modulation signal may then be developed, in a gate drive conditioning control circuit 310, by a microprocessor, microcontroller, ASIC, PLD, discrete analog circuitry or discrete digital circuitry. An input to the gate drive conditioning circuit 310 may include a characteristic, such as the minor current 332, a switch temperature, or a voltage across the switch, determined at a time associated with the switch operation. The time associated with the switch may include a time when the switch is activated and passing current, or a predetermined time before or after the switch is engaged or disengaged. The output of the gate drive conditioning control circuit 310 is the gate drive circuit 302.

The gate drive circuit may include a transistor 314 and a current limiting resistor 320 to drive or inject a current on the gate of the switch 304. This is a commonly referred to as a high-side driver as it connects the gate of the IGBT 304 with Power (Vcc). Likewise, the gate drive circuit may include a transistor 316 and a current limiting resistor 318 to withdraw or extract a current from the gate of the switch 304. The transistors (314, 316) may be complementary transistors (e.g., N-channel MOSFET and P-channel MOSFET, NPN BJT and PNP BJT, or similar) or may both be of similar structure (e.g., N-channel MOSFETs, NPN BJTs) with the gate edge conditioning circuit 310 including a charge pump to meet the voltage and current needs of the transistors (e.g., N-channel MOSFET). Based on the voltage Vcc, the transistor 314, the resistor 320 and the potential of the switch, a gate current 334 may flow onto the gate of the switch 304. The rate at which current flows onto the gate is proportional to the speed at which the switch transitions between the off-state to the on-state. Likewise, based on the voltage Vee, the transistor 316, the resistor 318 and the potential of the switch, a gate current 334 may flow from the gate of the switch 304. The rate at which current flows from the gate is proportional to the speed at which the switch transitions between the on-state to the off-state.

Typically gate resistors (e.g., 318, 320) are required in the circuit design to limit the IGBT gate charge/discharge current. In order to control the IGBT switching transient speed in terms of change in load current 330 in relation to change in time (dI/dt) and change in voltage across the switch in relation to change in time (dV/dt), the gate resistors (e.g., 318, 320) are usually conservatively chosen. Specifically, an IGBT gate drive design including a large gate resistance (e.g., 318, 320) will have slow switching transients, low voltage overshoot (dV/dt) and low current overshoot (dI/dt), however the slow transitioning may result in large switching losses. Alternatively, a small gate resistance (e.g., 318, 320) will have a faster switching transient, providing a reduced power loss, however the faster transitioning may result in greater voltage overshoot (dV/dt) and greater current overshoot (dI/dt), along with a possibility of increased Electromagnetic Interference/Electromagnetic Compatibility (EMI/EMC) concerns. Due to reliability concerns, in practice traction inverter designs usually exaggerate the gate resistance in order to guarantee that under worst case scenarios the switching transient resultant voltage overshoot should not exceed the IGBT maximum voltage rating. The IGBT maximum voltage rating is due to IGBTs being vulnerable to over-voltage spikes. For example, if one switching transient resultant voltage spike exceeds the IGBT maximum rated voltage, the voltage spike may cause IGBT avalanche breakdown and permanently damage the IGBT. The exaggerated gate resistance will increase power module switching losses, and as a result, it will impact HEV overall fuel economy as well as add difficulties to power module cooling design.

A remedy includes a smart gate drive circuit in which the IGBT switching speed may be optimized dynamically. An example of this is illustrated in FIG. 3, the circuit 300 includes the gate driver 302, and the gate driver 302 includes a transistor 322 and associated resistor 328 in parallel with the transistor 314 and associated resistor 320. This parallel configuration allows increased current to flow onto the gate of the IGBT 304. The increase in current flow onto the gate is proportional to an increase in transition speed of the IGBT. The increase in transition speed is proportional to a decrease in switching power loss. When the IGBT 304 is turned on with an increased current flow to the gate, a channel is enhanced under the gate allowing the IGBT to saturate resulting in a decrease in voltage across the IGBT 304 ($V_{ce}$). The faster decrease in voltage across the IGBT and enhanced channel allow a faster increase in load current flow 330 and mirror current flow 332. In this example, a pair of transistors (314 and 322) connected with associated resistors (320 and 328) configured in parallel are shown, however, this circuit is not limited to this configuration and may include multiple switches (e.g., MOSFETs. BJTs) wherein the BJTs may be connected with associated resistors and the MOSFETs flow current directly to the gate of the IGBT 304 limited by the MOSFET's channel on resistance, ($R_{on}$).

The gate drive conditioning circuit 310 may comprise at least one AND gate to drive the transistor 322 based on an enable signal and the modulation signal. The gate drive conditioning circuit 310 may comprise an OR gate to drive the transistor 324 based on the inverse of the enable signal and the modulation signal Likewise, the gate drive conditioning circuit 310 may comprise at least one buffer, driver, tri-state buffer, AND gate or OR gate of an inverting or non-inverting type to drive the transistors (314, 316, 322 and 324) based on an enable signal and the modulation signal.

A complementary example is also illustrated in FIG. 3, the circuit 300 includes the gate driver 302, and the gate driver 302 includes a transistor 324 and associated resistor 326 in parallel with the transistor 316 and associated resistor 318. This parallel configuration allows increased current to flow from the gate of the IGBT 304. The increase in current flow from the gate is proportional to an increase in transition speed of the IGBT. The increase in transition speed is proportional to a decrease in switching power loss. When the IGBT 304 is turned off with an increased current flow from the gate, shutting off the switch 304 results in a faster increase in voltage across the IGBT 304, and a faster decrease in load current flow 330 and minor current flow 332.

The minor current 332 may be buffered in a minor current buffer circuit 308 to produce a buffered minor current 334. The mirror current buffer circuit 308 may include a filter such as a low pass filter, a band-pass filter, a notch filter or a high pass filter. The filter may be a Finite Impulse Response (FIR) filter, an Infinite Impulse Response (IIR) filter or other appropriate filter. The buffered minor current 334 may be sampled or latched in a latch circuit 306. The latch circuit 306 may be based on the gate voltage of the IGBT 304. The latch circuit 306 may include a filter such as a low pass filter, a band-pass filter, a notch filter or a high pass filter to filter the gate voltage or appropriate control signal. The filter may be a Finite Impulse Response (FIR) filter, an Infinite Impulse Response (IIR) filter or other appropriate filter. A latched buffer minor current signal 336 may be provided to the gate edge conditioning circuit 310 as an input to determine a desired rate of change of the switch 304. The latched buffer mirror current signal 336 may be used directly as an enable signal to enable additional current sources to drive the IGBTs (e.g., 314, 316, 322 and 324) or may be an input to the controller 312 which is used to generate an enable signal based on more complex conditions.

Figure 4:
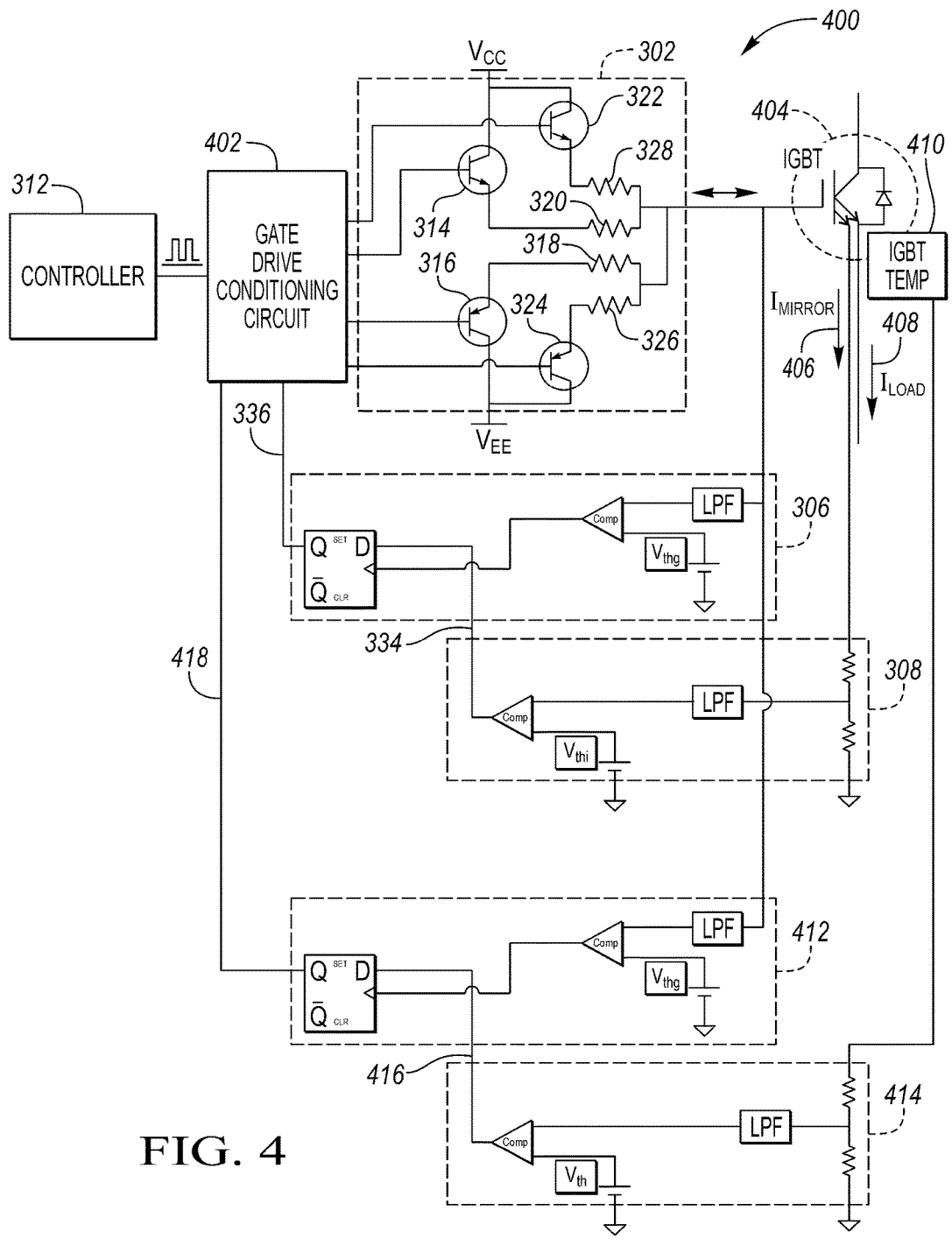
FIG. 4 is a schematic of an exemplary configuration of an IGBT driver with mirror current feedback and temperature feedback.

FIG. 4 is a schematic of an exemplary configuration of an IGBT driver with minor current feedback and temperature feedback. Similar to FIG. 3, FIG. 4 includes a current minor configuration to provide feedback and to be used as input to a gate drive conditioning circuit 402. However, FIG. 4 also comprises a temperature sensor 410. The temperature sensor 410 may be monolithic (i.e., fabricated in the same semiconductor device) or may be a separate sensor thermally coupled to the IGBT. A separate sensor thermally coupled with the IGBT may be within a multi-chip module (MCM) or may be a discrete sensor placed in proximity with the IGBT.

The IGBT temperature sensor 410 may produce a buffered IGBT temperature signal 416 in an IGBT temperature buffer circuit 414 based on the temperature sensor 410. The IGBT temperature buffer circuit 414 may include a filter such as a low pass filter, a band-pass filter, a notch filter or a high pass filter to filter the signal from the temperature sensor. The filter may be a Finite Impulse Response (FIR) filter, an Infinite Impulse Response (IIR) filter or other appropriate filter. The buffered IGBT temperature signal 416 may be sampled or latched in a temperature latch circuit 412. The temperature latch circuit 412 may be based on the gate voltage of the IGBT 404 or the controller 312 may control the temp latch circuit 412. The temperature latch circuit 412 may include a filter such as a low pass filter, a band-pass filter, a notch filter or a high pass filter to filter the gate voltage or appropriate control signal. The filter may be a Finite Impulse Response (FIR) filter, an Infinite Impulse Response (IIR) filter or other appropriate filter. The latched buffer IGBT temperature signal 418 may be provided to the gate drive conditioning circuit 402 as an input to determine a desired rate of change of the switch 404. The latched buffer IGBT temperature signal 418 may be used directly as an enable signal to enable additional current sources to drive the IGBTs (e.g., 314, 316, 322 and 324) or may be an input to the controller 312 which is used to generate an enable signal based on more complex conditions.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. An inverter controller comprising:
    an IGBT having a gate, a first emitter configured to flow a load current, and a second emitter configured to flow a mirror current proportional to the load current;
    a gate driver coupled to the gate and configured to flow a plurality of currents;
    a buffer circuit configured to output a buffered signal based on the mirror current; and
    a latch circuit configured to output a signal to configure the gate driver to flow a selected current from the plurality of currents in response to the buffered signal and a gate voltage greater than a threshold, wherein the latch circuit includes a filter to filter the gate voltage.

2. The controller of claim 1, wherein the gate driver includes a plurality of MOSFETs selectively engageable, coupled in parallel, and configured to provide the plurality of currents at a voltage.

3. The controller of claim 1, wherein the gate driver includes a plurality of selectively engageable resistors.

4. The controller of claim 1, wherein the buffer circuit includes a low pass filter.

5. The controller of claim 1, further comprising a temperature sensor thermally coupled with the IGBT and a temperature latch circuit to output a temperature signal to configure the gate driver to flow a selected current from the plurality of currents in response to the temperature signal.

6. The controller of claim 5, further comprising a temperature buffer circuit coupled with the temperature sensor.

7. The controller of claim 6, wherein the temperature buffer circuit includes a low pass filter.

8. The controller of claim 1, further comprising an electric machine, having a rotational speed, coupled with the first emitter and a speed latch circuit to output a speed signal to configure the gate driver to flow a selected current from the plurality of currents in response to the speed signal, the buffered signal and a gate voltage greater than a threshold.

9. An inverter controller comprising:
    an IGBT having a gate, a first emitter and second emitter, and configured such that a mirror current flowing from the first emitter is proportional to a load current flowing from the second emitter;
    a variable current voltage control device coupled to the gate; and
    at least one controller programmed to change a current flow from the variable current voltage control device based on the mirror current and a temperature of the IGBT.

10. The controller of claim 9, wherein the variable current voltage control device includes a plurality of MOSFETs selectively engageable, coupled in parallel, and configured to provide a plurality of currents at a voltage.

11. The controller of claim 9, wherein the variable current voltage control device includes a plurality of selectively engageable resistors.

12. The controller of claim 9, wherein the at least one controller is further programmed to change the current flow of the variable current voltage control device based on a filtered temperature of the IGBT.

13. A method for controlling a vehicle inverter comprising:
    applying a gate voltage to a gate of an IGBT having a first and second emitter to cause a current flow;
    in response to the gate voltage,
        sampling a mirror current output from the second emitter that is proportional to a drive current output from the first emitter, and
        sampling an IGBT temperature in response to the gate voltage; and
    changing the current flow to the gate in response to the IGBT temperature, the mirror current, and the gate voltage.

14. The method of claim 13, wherein changing the current flow is selecting the current flow from a plurality of current flows.

15. The method of claim 13, further comprising filtering the mirror current.

16. The method of claim 13, further comprising filtering the IGBT temperature.

17. The method of claim 16, further comprising sampling a rotational speed of an electric machine coupled to the first emitter and wherein changing the current flow to the gate is responsive to the rotational speed, the IGBT temperature, the mirror current, and the gate voltage.

\* \* \* \* \*